(12) United States Patent
Kinoshita et al.

(10) Patent No.: US 12,498,754 B2
(45) Date of Patent: Dec. 16, 2025

(54) FOLDING ELECTRONIC APPARATUS WITH MAGNETIC CLOSING

(71) Applicant: Lenovo (Singapore) Pte. Ltd., Singapore (SG)

(72) Inventors: Hiroaki Kinoshita, Kanagawa (JP); Yalu Liu, Kanagawa (JP); Daisuke Takahashi, Kanagawa (JP); Takamasa Suzuki, Kanagawa (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 153 days.

(21) Appl. No.: 18/495,257

(22) Filed: Oct. 26, 2023

(65) Prior Publication Data

US 2024/0219958 A1     Jul. 4, 2024

(30) Foreign Application Priority Data

Dec. 28, 2022   (JP) ................................. 2022-212179

(51) Int. Cl.
*G06F 1/16*     (2006.01)

(52) U.S. Cl.
CPC .......... *G06F 1/1616* (2013.01); *G06F 1/1652* (2013.01); *G06F 1/1679* (2013.01); *G06F 1/1681* (2013.01)

(58) Field of Classification Search
CPC .... G06F 1/1616; G06F 1/1652; G06F 1/1679; G06F 1/1681; G06F 1/1641
See application file for complete search history.

(56) References Cited

U.S. PATENT DOCUMENTS

| 2018/0160545 A1* | 6/2018 | Kim | ....................... H05K 1/028 |
| 2020/0267861 A1* | 8/2020 | Kim | ....................... G06F 1/1681 |
| 2021/0034102 A1* | 2/2021 | Cho | ....................... H01F 7/0226 |

FOREIGN PATENT DOCUMENTS

| JP | 6077025 B2 | 2/2017 |
| JP | 6453413 B1 | 1/2019 |

* cited by examiner

*Primary Examiner* — Allen L Parker
*Assistant Examiner* — Dakota M Talbert
(74) *Attorney, Agent, or Firm* — Osha Bergman Watanabe & Burton LLP (57) ABSTRACT

An electronic apparatus includes: a first chassis member that has a first wall portion; a second chassis member that has a second wall portion and is adjacent to the first chassis member; a hinge device that connects the first chassis member and the second chassis member to be relatively rotatable between a first posture, in which the first chassis member and the second chassis member are laminated so as to overlap each other in a surface normal direction, to dispose the first wall portion and the second wall portion at positions facing each other, and a second posture in which the first chassis member and the second chassis member are arranged side by side in a direction perpendicular to the surface normal direction; and a magnet that has a side surface and a bottom surface and is attached to the first wall portion.

5 Claims, 7 Drawing Sheets

FOLDING ELECTRONIC APPARATUS WITH MAGNETIC CLOSING

CROSS-REFERENCE TO RELATED APPLICATIONS

This application claims priority to Japanese Patent Application No. 2022-212179 filed on Dec. 28, 2022, the contents of which are hereby incorporated by reference in its entirety.

BACKGROUND

Technical Field

The present invention relates to an electronic apparatus in which a plurality of chassis members are rotatably connected.

Description of Related Art

For example, an electronic apparatus such as a laptop PC or a tablet PC has a configuration in which two chassis members are connected by a hinge device (see, for example, Japanese Patent Nos. 6453413 and 6077025).

In the electronic apparatus as described above, a magnet may be provided at an edge portion of each chassis member to prevent opening in a state where two chassis members are closed. The magnet is fixed to the chassis member using, for example, an adhesive, but when the adhesion is poor or the like, the magnet may fall off when the electronic apparatus is assembled or the like.

Meanwhile, an electronic apparatus adopting a flexible display as in Japanese Patent No. 6453413 may be disposed close to the display and the magnet because the display extends to the edge portion of each chassis member. In this case, if the electronic apparatus receives a strong impact, the magnet may not fall off, but may be displaced, and may make contact with the display or a peripheral component thereof, thus causing a failure.

SUMMARY

The present invention has been made in view of the above-described problems of the prior art, and a main object of the present invention is to provide an electronic apparatus capable of preventing a magnet from falling off from a chassis member. Another object of the present invention is to provide an electronic apparatus capable of preventing a magnet from making contact with a display to cause a failure.

An electronic apparatus according to the first aspect of the present invention includes: a first chassis member that has a first wall portion; a second chassis member that has a second wall portion and is adjacent to the first chassis member; a hinge device that connects the first chassis member and the second chassis member to be relatively rotatable between a first posture, in which the first chassis member and the second chassis member are laminated so as to overlap each other in a surface normal direction, to dispose the first wall portion and the second wall portion at positions facing each other, and a second posture in which the first chassis member and the second chassis member are arranged side by side in a direction perpendicular to the surface normal direction; a magnet that has a side surface and a bottom surface and is attached to the first wall portion; and an attracted body that is attached to the second wall portion and attracts the magnet in the first posture, in which the first wall portion has an accommodation hole formed to be inserted with the magnet, having an opening portion facing a side of the second wall portion in the first posture, a side inner wall surface supporting the side surface of the magnet, and a bottom wall surface supporting the bottom surface of the magnet, and accommodating the magnet, and a recessed portion formed in a part of the side inner wall surface of the accommodation hole and recessed in a direction intersecting a direction of inserting the magnet into the accommodation hole, and the magnet further has a locking part protruding from a part of the side surface and inserted into the recessed portion.

An electronic apparatus according to the second aspect of the present invention includes: a first chassis member that has a first wall portion; a second chassis member that has a second wall portion and is adjacent to the first chassis member; a hinge device that connects the first chassis member and the second chassis member to be relatively rotatable between a first posture, in which the first chassis member and the second chassis member are laminated so as to overlap each other in a surface normal direction, to dispose the first wall portion and the second wall portion at positions facing each other, and a second posture in which the first chassis member and the second chassis member are arranged side by side in a direction perpendicular to the surface normal direction; a magnet that is attached to the first wall portion; an attracted body that is attached to the second wall portion and attracts the magnet in the first posture; a display formed in a sheet shape having flexibility, extending over the first chassis member and the second chassis member, and having one side of an outer peripheral edge portion provided at a position facing the first wall portion; and a control board connected to the display to control display of the display, in which a folding portion that is folded to a rear side of the display is provided between the display and the control board so as to wrap around the one side, and the magnet has a relief portion that faces the folding portion, retreats from the folding portion to avoid the folding portion, and forms a predetermined gap between the relief portion and the folding portion.

According to an aspect of the present invention, it is possible to provide an electronic apparatus capable of preventing a magnet from falling off from a chassis member. According to another aspect of the present invention, it is possible to prevent the magnet from making contact with the display to cause a failure.

DETAILED DESCRIPTION

An electronic apparatus according to the present invention will be described in detail below with preferred embodiments with reference to the accompanying drawings.

First, a schematic configuration of an electronic apparatus 10 according to the present embodiment will be described.

Figure 1:
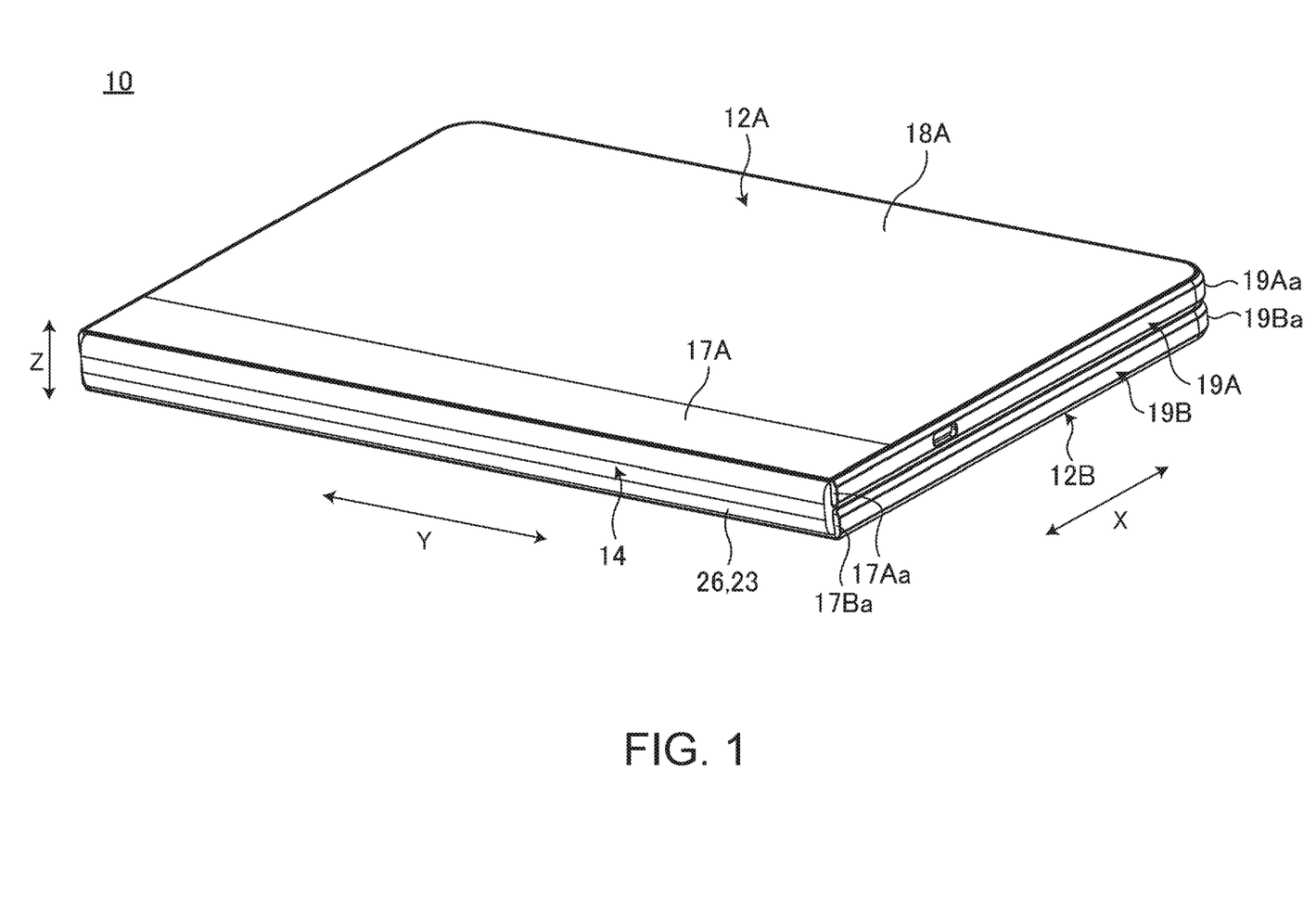
FIG. 1 is a perspective view schematically illustrating a state in which an electronic apparatus according to an embodiment is closed and in a 0-degree posture.
Figure 2:
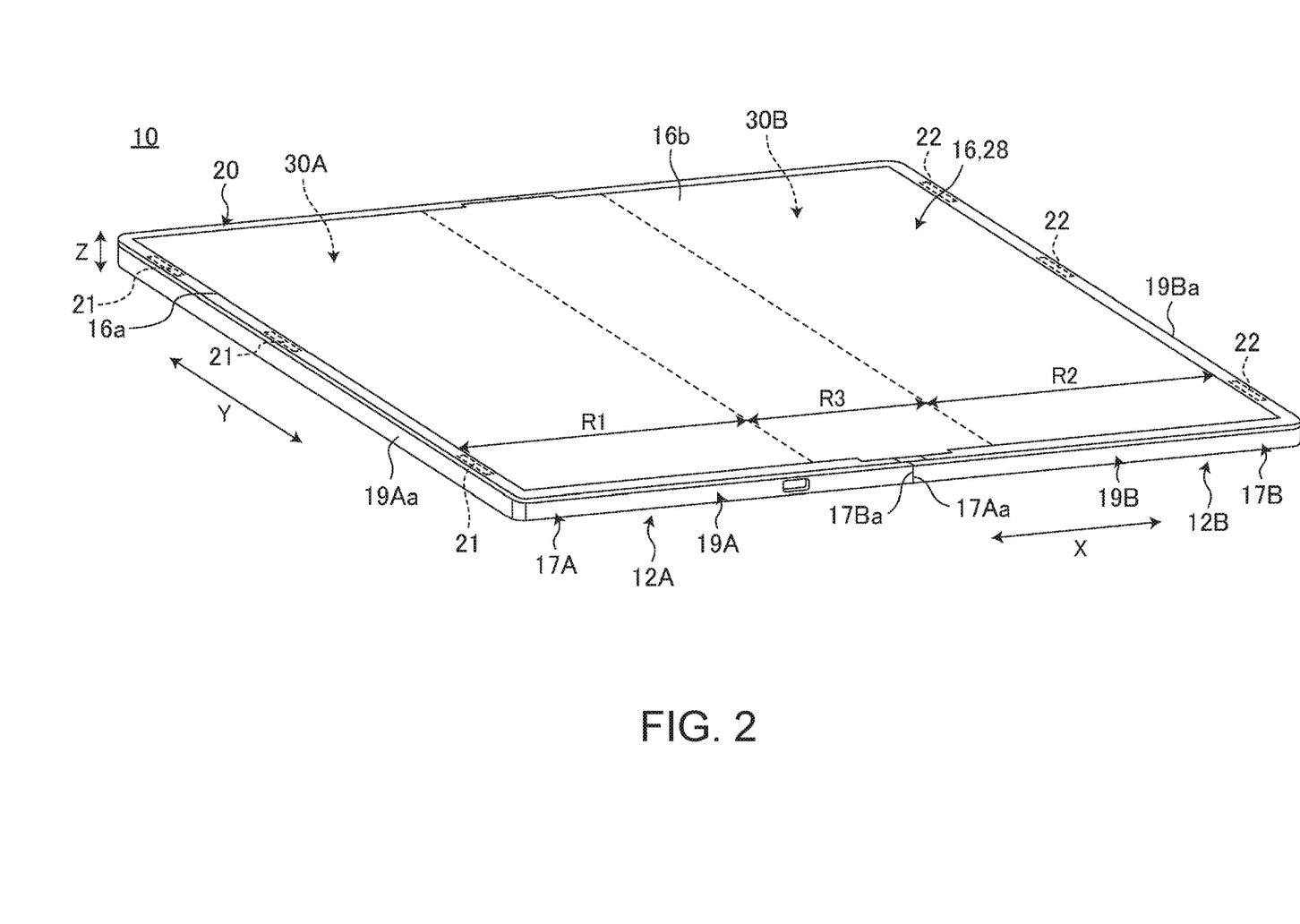
FIG. 2 is a perspective view schematically illustrating a state in which the electronic apparatus illustrated in FIG. 1 is opened and in a 180-degree posture.
Figure 3:
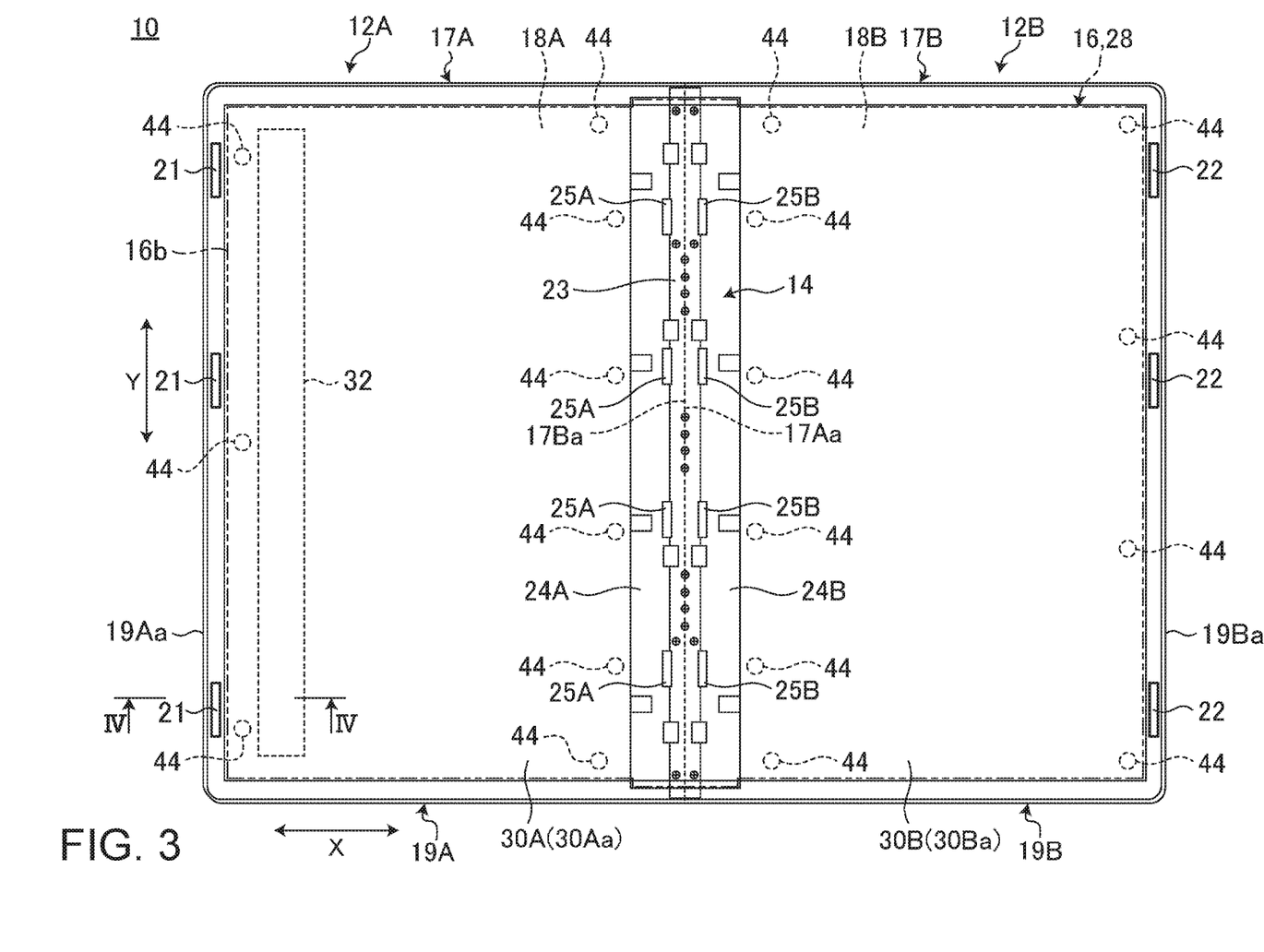
FIG. 3 is a plan view schematically illustrating an internal structure of the electronic apparatus illustrated in FIG. 2.

FIG. 1 is a perspective view schematically illustrating a state in which the electronic apparatus 10 according to an embodiment is closed and in a 0-degree posture. FIG. 2 is a perspective view schematically illustrating a state in which the electronic apparatus 10 illustrated in FIG. 1 is opened and in a 180-degree posture. FIG. 3 is a plan view schematically illustrating an internal structure of the electronic apparatus 10 illustrated in FIG. 2.

As illustrated in FIGS. 1 to 3, the electronic apparatus 10 includes a first chassis member 12A and a second chassis member 12B, a hinge device 14, and a display assembly 16. The electronic apparatus 10 of the present embodiment exemplifies a tablet PC or a laptop PC that is capable of being folded like a book. The electronic apparatus 10 may be a smartphone, a portable game machine, or the like.

Each of the chassis members 12A and 12B is disposed adjacent to each other. The first chassis member 12A includes a first frame member 17A and a first rear surface plate 18A. The first frame member 17A is a rectangular frame-shaped member having a wall portion 19A, which is a standing wall, formed on three-side edge portion other than an edge portion 17Aa adjacent to the second chassis member 12B. The first rear surface plate 18A is a plate-shaped member that closes a rear surface opening of the first frame member 17A (see also FIG. 4). Similarly, the second chassis member 12B includes a second frame member 17B that has a wall portion 19B, which is a standing wall, formed on three-side edge portion other than an edge portion 17Ba adjacent to the first chassis member 12A, and a second rear surface plate 18B that closes a rear surface opening of the second frame member 17B. Front surface openings of the frame members 17A and 17B are closed with the display assembly 16 and a bezel member 20.

Each of the members 17A, 17B, 18A, and 18B is made of, for example, a metal member such as stainless steel, magnesium, or aluminum, or a fiber-reinforced resin plate containing reinforcing fibers such as carbon fiber, and the like.

As illustrated in FIGS. 2 and 3, the first chassis member 12A has a magnet 21 that is attached to an outer wall portion 19Aa in an X direction parallel to the edge portion 17Aa. Similarly, the second chassis member 12B has an attracted body 22 that is attached to the outer wall portion 19Ba in the X direction parallel to the edge portion 17Ba. The attracted body 22 may be a member capable of attracting the magnet 21, and can exemplify a magnet capable of attracting the magnet 21 or a magnetic body such as iron. The front surfaces of the magnet 21 and the attracted body 22 are covered with the bezel member 20 and are hidden from the outside. The magnet 21 and the attracted body 22 are for attracting between the wall portions 19Aa and 19Ba that face each other while being close to each other in the 0-degree posture, and are for preventing opening or rattling of the chassis members 12A and 12B.

The hinge device 14 connects the chassis members 12A and 12B to be relatively rotatable. The hinge device 14 also functions as a rear cover that hides a gap between the edge portions 17Aa and 17Ba formed in the 0-degree posture illustrated in FIG. 1. The display assembly 16 extends over the chassis members 12A and 12B.

Hereinafter, as for the electronic apparatus 10, description is performed while the direction in which the chassis members 12A and 12B are arranged is called an X direction, the direction along the edge portions 17Aa and 17Ba orthogonal to the X direction is called a Y direction, and the thickness direction of the chassis members 12A and 12B is called a Z direction. As for the angular posture between the chassis members 12A and 12B, description is performed while a state in which the chassis members 12A and 12B are laminated so as to overlap each other in the surface normal direction is called the 0-degree posture (see FIG. 1), and a state in which the chassis members 12A and 12B are aligned to each other in a direction perpendicular to the surface normal direction (X direction) is called the 180-degree posture (see FIG. 2). It is possible to call the posture between 0 and 180 degrees by appropriately carving the angle. For example, a state in which the surface normal directions of the chassis members 12A and 12B are orthogonal to each other is a 90-degree posture. These angles are for convenience of description, and the actual product may of course have angular positions slightly deviated from the exact angular positions indicated by angle numbers.

As illustrated in FIG. 3, the hinge device 14 of the present embodiment has a hinge base 23, support plates 24A and 24B, and a plurality of link arms 25A and 25B.

The hinge base 23 is provided at a position straddling the edge portions 17Aa and 17Ba of the chassis members 12A and 12B, and extends over the substantially entire length in the Y direction along the edge portions 17Aa and 17Ba. The hinge base 23 is a block-shaped component formed of a metal material such as aluminum. The hinge base 23 supports two hinge shafts aligned in the X direction in the 180-degree posture. The plurality of link arms 25A aligned in the Y direction are pivotally supported on one hinge shaft, and the plurality of link arms 25B aligned in the Y direction are pivotally supported on the other hinge shaft. Each link arm 25A is pivotally supported by a bracket fixed to the first frame member 17A. Each link arm 25B is pivotally supported by a bracket fixed to the second frame member 17B.

As a result, the hinge base 23 connects the chassis members 12A and 12B to be relatively rotatable. The inside of the hinge base 23 is also provided with a gear mechanism for synchronizing the rotational movement between the chassis members 12A and 12B, a torque mechanism for applying a predetermined rotational torque to the rotational movement between the chassis members 12A and 12B, and the like. A rear cover component 26 serving as a decorative cover is attached to an outer surface of the hinge base 23 (see FIG. 1).

The support plates 24A and 24B are plates that are formed of a metal material such as aluminum, extend in the Y direction, and have bilaterally symmetrical shapes. The support plates 24A and 24B are pivotally supported with respect to brackets, on which the link arms 25A are 25B are pivotally supported, thereby being swingable. The support plates 24A and 24B are aligned on the left and right sides of the hinge base 23 in the 180-degree posture, and front surfaces thereof are coplanar with the front surface of the hinge base 23. As a result, the hinge device 14 can support a bending region R3 (see FIG. 2) of the display laminate 18, which will be described later, in the 180-degree posture.

Next, a configuration example of the display assembly 16 will be described.

Figure 4:
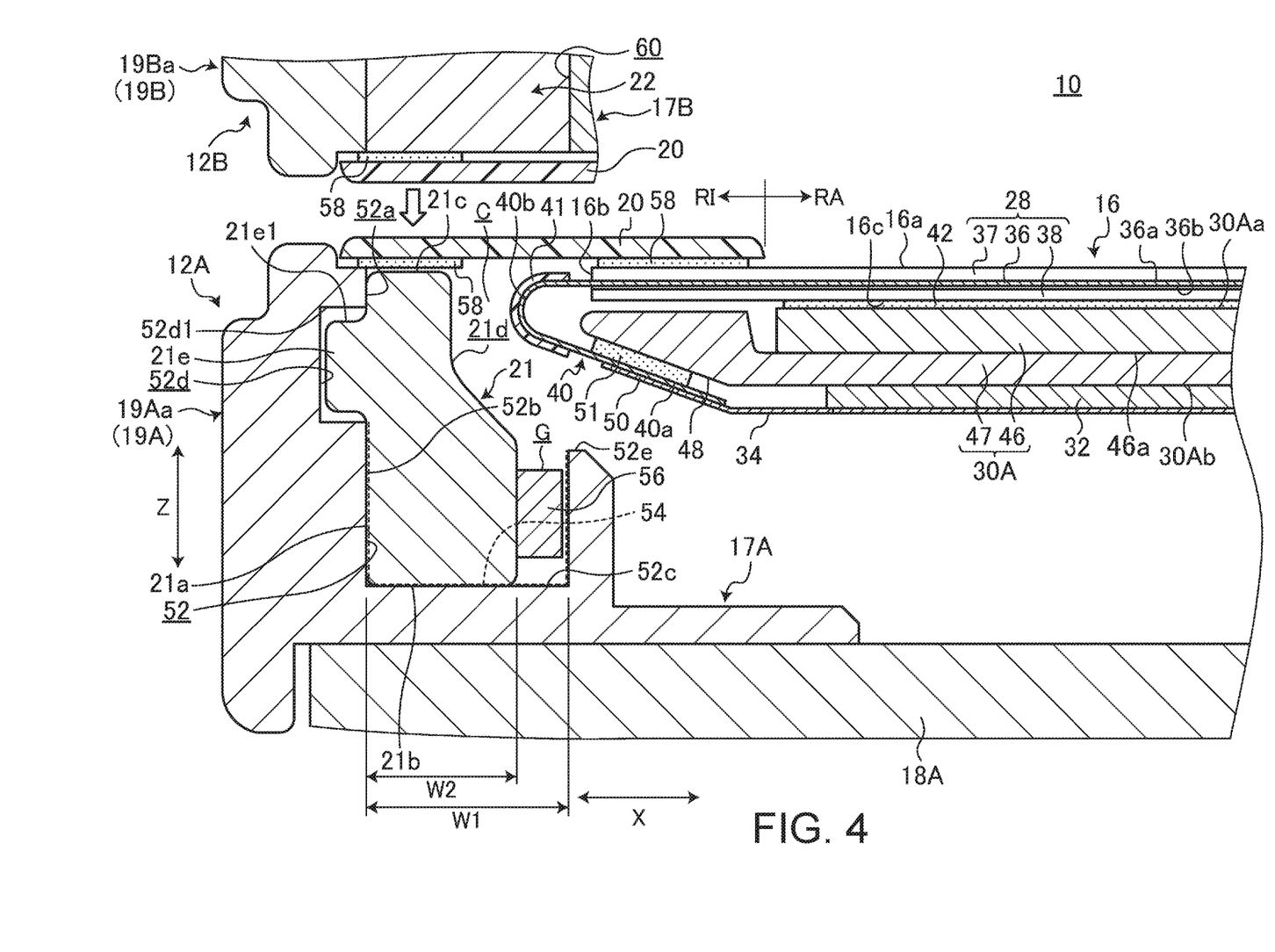
FIG. 4 is a schematic cross-sectional view taken along line IV-IV in FIG. 3.

FIG. 4 is a schematic cross-sectional view taken along line IV-IV in FIG. 3. As illustrated in FIGS. 3 and 4, the display assembly 16 includes a display 28, a first plate 30A, a second plate 30B, a control board 32, and four flexible boards 34. The display assembly 16 of the present embodiment has an assembly structure in which the respective components are integrally assembled, and is integrally assembled to the chassis members 12A and 12B.

The display 28 is formed in a flexible sheet shape as a whole. In the 0-degree posture illustrated in FIG. 1, the chassis members 12A and 12B are in a state of being folded in half and laminated on each other, and the wall portions 19Aa and 19Ba are close to each other while facing each other. At this time, the display 28 is in a state in which a first region R1 on the side of the first chassis member 12A and a second region R2 on the side of the second chassis member 12B, which are illustrated in FIG. 2, are disposed so as to face each other, and the bending region R3 between the regions R1 and R2 is bent in an arc shape. In the 180-degree posture illustrated in FIGS. 2 and 3, the chassis members 12A and 12B are disposed side by side in the X direction, which is perpendicular to the surface normal direction. In this case, the display 28 has the regions R1 and R2 and the bending region R3 disposed side by side on an XY plane, and forms a flat plate shape as a whole.

As illustrated in FIG. 4, the display 28 is obtained by laminating a display body 36, a front surface sheet 37, and a rear surface sheet 38.

The display body 36 is, for example, a plastic organic electro-luminescence diode (POLED). The display body 36 includes an active region RA and a non-active region RI surrounding the active region RA. The active region RA is a region for displaying an image, in which pixels arranged in a matrix shape are disposed. The non-active region RI is a region for displaying no image, and is provided so as to surround the active region RA. In the non-active region RI, for example, a wire, terminals, a driving circuit, and the like connected to the flexible board 34 are disposed.

A front surface sheet 37 is laminated on a front surface 36a of the display body 36. The front surface sheet 37 forms an outermost surface (front surface 16a) of the display assembly 16. The display 28 of the present embodiment is a touch panel type display. Therefore, the front surface sheet 37 is formed of a sheet in which a polarizing film is laminated under a functional film having an anti-fingerprint function or the like. The display 28 may not be a touch panel type display.

The rear surface sheet 38 is laminated on a rear surface 36b of the display body 36. The rear surface sheet 38 is formed with a large number of hole portions in a metal sheet such as a stainless steel or the like. The rear surface sheet 38 has a certain degree of tension and is used to ensure the same radius of curvature as the design specifications when the display body 36 is bent. In FIG. 4, cross-sectional hatching of the sheets 37 and 38 is omitted in order to ensure the visibility of the drawings.

The display body 36 has an extended portion 40 that has an extending part of the non-active region RI and protrudes on a side rather than end surfaces of the sheets 37 and 38 laminated on each of the surfaces 36a and 36b. The extended portion 40 is provided on one side 16b, which faces the wall portion 19Aa extending along the Y direction of the first frame member 17A, among the four sides of the display assembly 16.

An end portion 40a of the extended portion 40 is connected to the flexible board 34 and fixed to the first plate 30A. The extended portion 40 has a folding portion 40b between the end portion 40a and an end surface of the display 28 along one side 16b. The folding portion 40b is a portion in which the display body 36 is bent in an arc shape to a rear side of the display assembly 16 so as to wrap around one side 16b. A protective layer 41 for protecting the folding portion 40b is provided on an outer peripheral surface of the folding portion 40b. The protective layer 41 is, for example, an acrylic-based resin or the like. The folding portion 40b may be formed by bending the flexible board 34 instead of the display body 36.

As illustrated in FIGS. 3 and 4, the plates 30A and 30B are disposed while interposing the hinge device 14 therebetween with a gap on the left and right, and the respective front surfaces 30Aa and 30Ba support the rear surface 16c of the display 28. The rear surface 16c of the display 28 has the first region R1 that is fixed to the front surface 30Aa of the first plate 30A and the second region R2 that is fixed to the front surface 30Ba of the second plate 30B. The regions R1 and R2 are fixed to the plates 30A and 30B using, for example, an adhesive material 42 such as a double-sided tape. The first plate 30A is fastened to the first frame member 17A. The second plate 30B is fastened to the second frame member 17B. Reference numeral 44 in FIG. 3 exemplifies an arrangement of a fastening portion in which the plates 30A and 30B and the frame members 17A and 17B are screwed together.

The plates 30A and 30B of the present embodiment are composed of a base plate 46 and a metal frame 47. The base plate 46 is, for example, a carbon fiber reinforced resin plate in which carbon fibers are impregnated with a matrix resin such as an epoxy resin. The metal frame 47 is formed of, for example, magnesium alloy or the like, and fixed to an outer peripheral edge portion of the rear surface 46a of the base plate 46. The metal frame 47 is fixed to the base plate 46 with an adhesive or the like so as to surround an outer peripheral end surface of the base plate 46 formed of a carbon fiber resin and an outer edge portion of the rear surface 46a. In the plates 30A and 30B, the base plate 46 may be formed of a metal material or a resin material instead of the carbon fiber reinforced resin plate, and the metal frame 47 may be omitted.

The first plate 30A has an inclined surface 48. The inclined surface 48 is formed on an end portion of the metal frame 47, which corresponds to one side 16b of the display assembly 16. The inclined surface 48 has, for example, a shape in which the edge of an end surface of the metal frame 47 is chamfered.

The control board 32 is a printed board for performing display control on the display assembly 16, that is, display control on the display body 36, and various semiconductor chips are mounted thereon. The control board 32 is fixed to the rear surface 30Ab of the first plate 30A. A motherboard mounted with a CPU and the like is installed inside the first chassis member 12A or the second chassis member 12B. The control board 32 is connected to the motherboard using a predetermined flexible board or the like.

The flexible board 34 connects the display body 36 and the control board 32. For example, four flexible boards 34 are parallel in the Y direction along one side 16b. The flexible boards 34 are connected to the end portion 40a of the extended portion 40, thereby being connected to the display body 36. The flexible boards 34 are disposed so as to be hidden on a side of the rear surface 30Ab of the first plate 30A by being connected to the end portion 40a at a tip of the folding portion 40b.

A connecting portion 50 between the flexible board 34 and the display body 36 is configured by electrical connection processing using, for example, an anisotropic conductive film (ACF), so-called ACF bonding. The connecting portion 50 is fixed to the inclined surface 48 of the first plate 30A by using the adhesive material 51. In the present embodiment, the end portion 40a of the extended portion 40 is fixed to the inclined surface 48 by using the adhesive material 51, so that the connecting portion 50 is fixed to the inclined surface 48.

Next, an example of a configuration and an attachment structure of the magnet 21 will be described.

Figure 5:
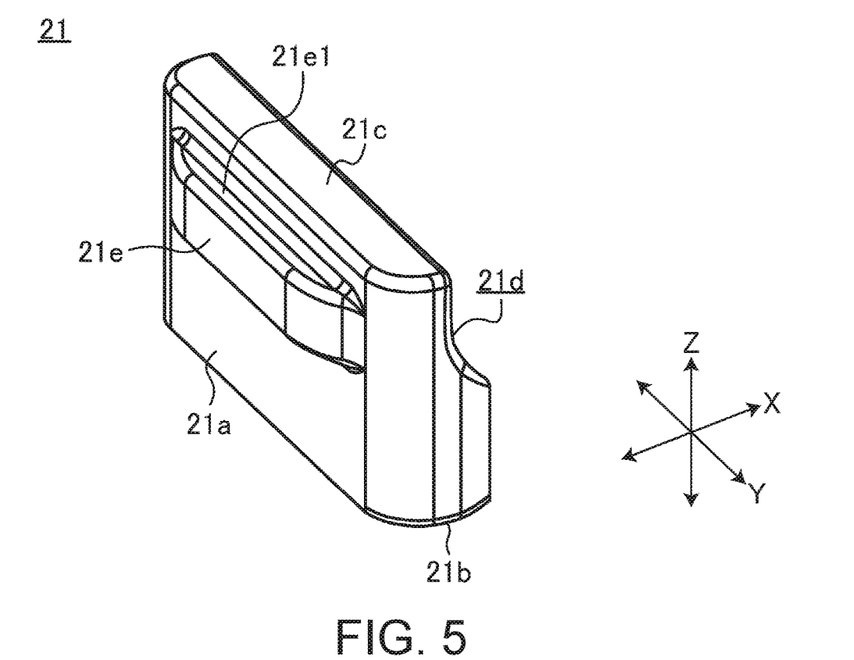
FIG. 5 is a perspective view of a magnet.
Figure 6:
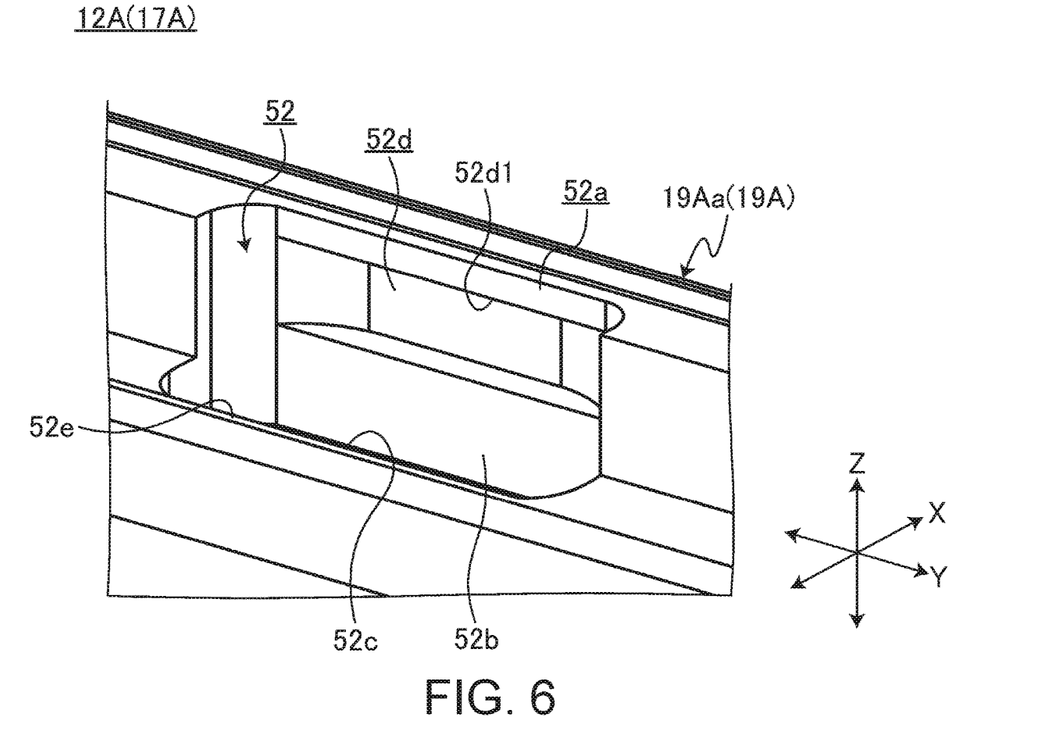
FIG. 6 is a perspective view of an accommodation hole for attaching the magnet to a wall portion of a first chassis member and a peripheral portion thereof.

FIG. 5 is a perspective view of the magnet 21. FIG. 6 is a perspective view of the accommodation hole 52 for attaching the magnet 21 to the wall portion 19Aa of the first chassis member 12A and a peripheral portion thereof. As illustrated in FIGS. 3 to 5, the magnet 21 is formed in a substantially rectangular shape when viewed in a front view and a plan view from the X and Z directions, and is formed in a substantially right-angled trapezoidal shape when viewed in a side view from the Y direction. The magnet 21 has a side surface 21a, a bottom surface 21b, a top surface 21c, a relief portion 21d, and a locking part 21e.

The side surface 21a is an upright surface forming four peripheral side surfaces of the magnet 21. The bottom surface 21b and the top surface 21c are flat surfaces along the X and Y directions, respectively. The magnet 21 has a surface area of the top surface 21c that is smaller than that of the bottom surface 21b. As a result, a cross section of the magnet 21 has a shape that is slightly tapered from a side of the bottom surface 21b to a side of the top surface 21c.

The relief portion 21d is formed on a surface of the side surface 21a facing a side of the folding portion 40b of the display 28 (a right side surface in FIG. 4). The relief portion 21d is a portion that is formed such that the side surface 21a gradually retreats from the folding portion 40b toward the top surface 21c and that is formed such that a width in the X direction of the magnet 21 is thin. As a result, the side surface 21a toward the side of the display 28 has a stepped shape having an inclined surface by first extending from the bottom surface 21b toward the top surface 21c along the Z direction, then being gradually inclined in a direction separated from the folding portion 40b in the X direction, and finally extending along the Z direction again. The relief portion 21d is for forming a predetermined gap C between the magnet 21 and the folding portion 40b. The gap C is set to a distance that can avoid the contact with the folding portion 40b even if the magnet 21 is slightly displaced in the accommodation hole 52 or rattling occurs.

The locking part 21e is formed on a surface of the side surface 21a that faces the side of the wall portion 19Aa at the rear side of the relief portion 21d (a left side surface in FIG. 4). The locking part 21e is a protrusion that protrudes from a part of the side surface 21a, and extends in the Y direction, for example. The locking part 21e has a locking surface 21e1, which is an XY plane toward the side of the top surface 21c. As described above, the locking part 21e of the present embodiment has a protrusion shape in which a part of the side surface 21a bulges. However, the shape of the locking part 21e is not limited as long as the locking part 21e is provided for forming a step between the locking part 21e and the top surface 21c. For example, a surface of the locking part 21e opposite to the locking surface 21e1 may be flush with the bottom surface 21b.

As illustrated in FIGS. 4 and 6, the wall portion 19Aa is formed with an accommodation hole 52 for attaching the magnet 21. The accommodation hole 52 is a hole portion for accommodating and holding the magnet 21 and extends in the Z direction. The accommodation hole 52 has an opening portion 52a, a side inner wall surface 52b, and a bottom wall surface 52c. The wall portion 19Aa is further provided with a recessed portion 52d integrally formed with the accommodation hole 52.

The opening portion 52a is provided on a front surface of the wall portion 19Aa to which the bezel member 20 is fixed. As a result, the accommodation hole 52 is open while facing the side of the wall portion 19Ba of the second chassis member 12B in the 0-degree posture (see FIG. 4). The side inner wall surface 52b is an inner peripheral side surface of the accommodation hole 52 and supports the side surface 21a of the magnet 21. The bottom wall surface 52c is a bottom surface of the accommodation hole 52 and supports the bottom surface 21b of the magnet 21. The accommodation hole 52 has a notch-shaped side wall 52e having a height lower than that of other portions, at a position corresponding to the relief portion 21d of the magnet 21. Similar to the relief portion 21d, the side wall 52e is provided to prevent interference with the folding portion 40b of the display 28.

The recessed portion 52d is an undercut-shaped portion that is formed in a part of the side inner wall surface 52b located on an outer surface side of the wall portion 19Aa in the X direction and has the side inner wall surface 52b recessed in the X direction. The recessed portion 52d has a shape into which the locking part 21e of the magnet 21 accommodated in the accommodation hole 52 can be inserted. In a state in which the magnet 21 is inserted into the locking part 21e, the recessed portion 52d locks the locking surface 21e1 at a ceiling 52d1 thereof. As a result, the magnet 21 is prevented from coming off from the opening portion 52a.

Next, an example of a procedure for attaching the magnet 21 to the accommodation hole 52 will be described.

Figure 7A:
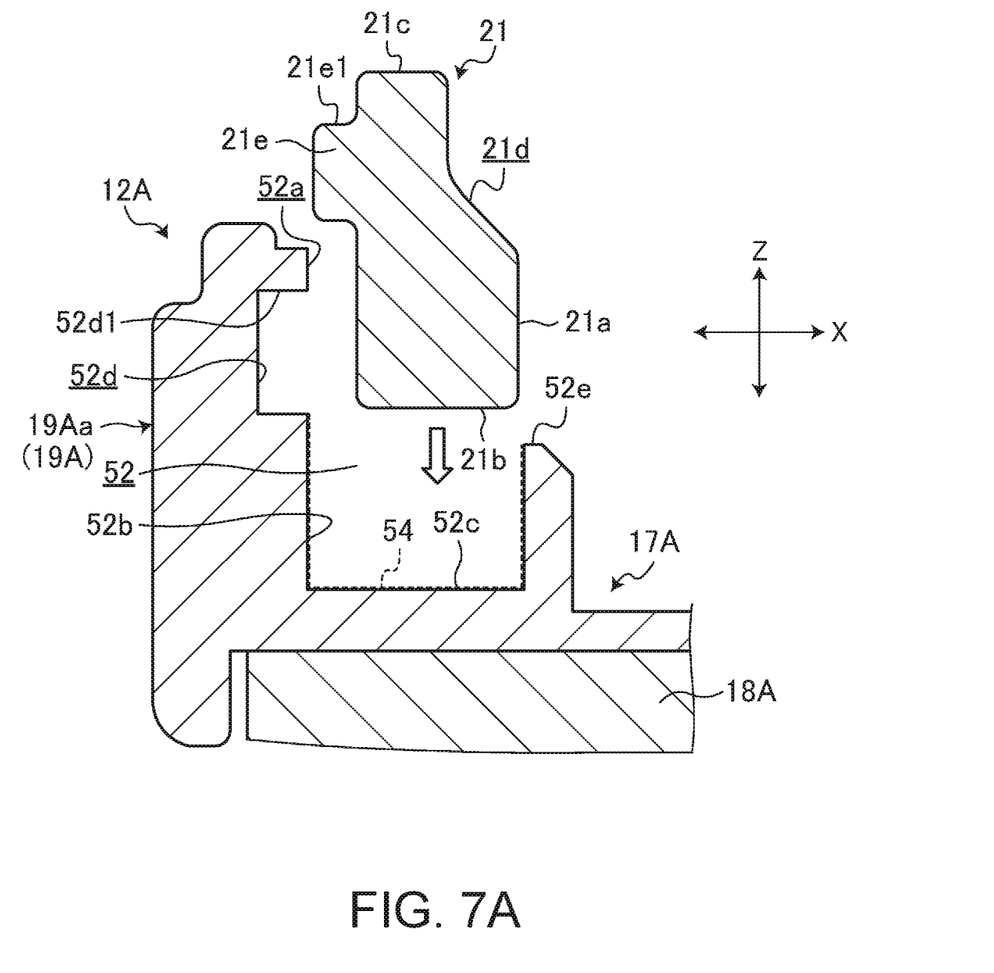
FIG. 7A is a schematic side cross-sectional view illustrating an operation of inserting the magnet into the accommodation hole.
Figure 7B:
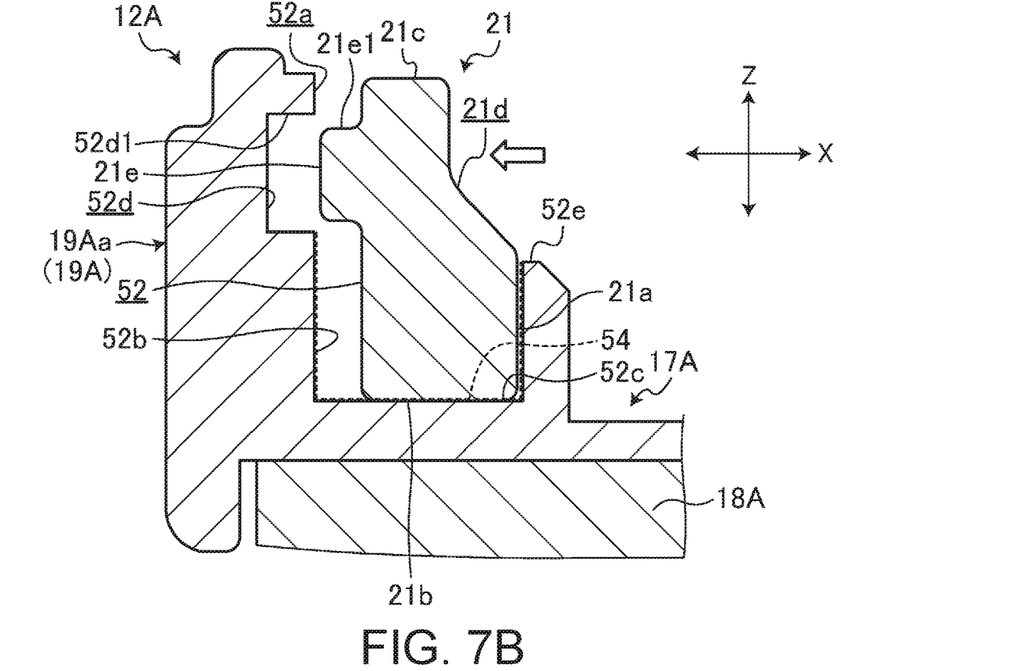
FIG. 7B is a view illustrating a state in which a locking part is inserted into a recessed portion by sliding the magnet from the state illustrated in FIG. 7A.
Figure 7C:
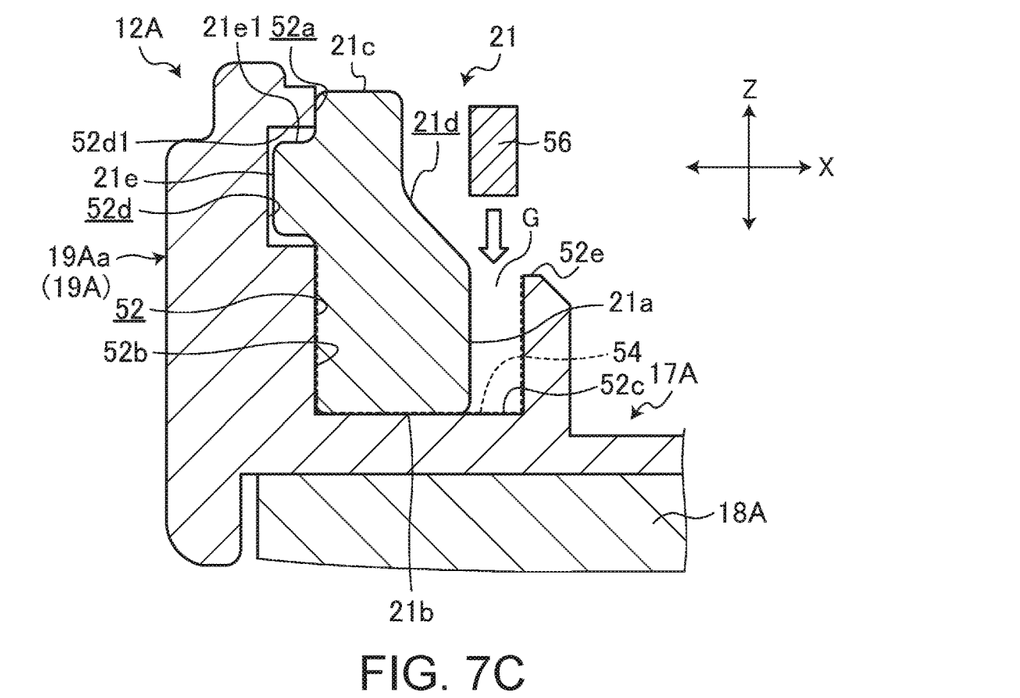
FIG. 7C is a view illustrating a state in which a spacer member is inserted into a gap between the magnet and the accommodation hole from the state illustrated in FIG. 7B.

FIGS. 7A to 7C are operation diagrams illustrating a procedure for attaching the magnet 21 to the accommodation hole 52. First, as illustrated in FIG. 7A, the magnet 21 is inserted into the accommodation hole 52 in the Z direction from the side of the bottom surface 21b to the opening portion 52a, and brings the bottom surface 21b into contact with the bottom wall surface 52c. In this case, an adhesive 54 is applied to the side inner wall surface 52b and the bottom wall surface 52c of the accommodation hole 52 in advance.

Subsequently, as illustrated in FIG. 7B, the magnet 21 is slid into the accommodation hole 52 in the X direction before the adhesive 54 is cured, and the locking part 21e is inserted into the recessed portion 52d. As a result, the locking surface 21e1 of the locking part 21e faces the ceiling 52d1 of the recessed portion 52d, and the magnet 21 is prevented from coming off from the accommodation hole 52. Thereafter, the adhesive 54 is cured, so that the magnet 21 is fixed to the wall portion 19Aa.

Meanwhile, the magnet 21 is required to be slid into the accommodation hole 52 in the X direction in order to insert the locking part 21e into the recessed portion 52d. That is, as illustrated in FIG. 4, a slide direction (X direction) of the magnet 21 is set to a reference, a width W1 of the accommodation hole 52 is required to be larger than a width W2 of the magnet 21 by a slide distance of the magnet 21. The slide distance is a distance for inserting the locking part 21e into the recessed portion 52d, and specifically, is equal to or longer than a protrusion length of the locking part 21e from the side surface 21a.

Therefore, after sliding, the gap G of the slide distance (W1-W2) remains between the side surface 21a opposite to the side of the locking part 21e of the magnet 21 and the side inner wall surface 52b opposite to the side of the recessed portion 52d of the accommodation hole 52. For example, when the chassis members 12A and 12B receive an impact such as drop, the gap G causes the magnet 21 to be displaced, and causes the magnet 21 to fall off from the accommodation hole 52 by coming off the locking part 21e from the recessed portion 52d.

In the present embodiment, it is preferable to further fit the spacer member 56 into the gap G from the side of the opening portion 52a (see FIG. 7C). The spacer member 56 is, for example, a resin or metal block. The spacer member 56 is interposed between the side surface 21a and the side inner wall surface 52b, and prevents the magnet 21 from being displaced in the accommodation hole 52 and the locking part 21e from falling off from the recessed portion 52d. The spacer member 56 may be fitted and fixed between the side surface 21a and the side inner wall surface 52b, may be fixed with the adhesive 54 applied to the side inner wall surface 52b, or may be fixed to the side surface 21a or the side inner wall surface 52b with an adhesive different from the adhesive 54.

However, in the present embodiment, the magnet 21 is fixed to the side inner wall surface 52b and the bottom wall surface 52c with the adhesive 54. Therefore, the spacer member 56 may be omitted, but it is preferable to provide the spacer member 56 in order to more reliably prevent the displacement of the magnet 21 in a case of an impact.

As described above, the magnet 21 is accommodated in the accommodation hole 52 and is attached to the wall portion 19Aa. After that, as illustrated in FIG. 4, the bezel member 20 is disposed so as to straddle between the front surface 16a of the display assembly 16 and the front surfaces of the wall portions 19A and 19B, and is fixed to each of the front surface 16a of the display assembly 16 and the front surfaces of the wall portions 19A and 19B with, for example, a double-sided tape 58. As a result, the bezel member 20 closes the opening portion 52a of the accommodation hole 52 together with the magnet 21, and the magnet 21 is more reliably prevented from coming off from the accommodation hole 52. The bezel member 20 may be formed of a material that does not interfere with the magnetic force of the magnet 21, for example, a thin sheet-like member made of resin such as polycarbonate (PC).

As illustrated in FIG. 4, the attracted body 22 that is attracted to the magnet 21 is accommodated in and held in an accommodation hole 60 formed in the wall portion 19Ba of the second chassis member 12B. In this case, since the attracted body 22 does not face the folding portion 40b of the display 28, the relief portion 21d such as the magnet 21 is not provided. In addition, the accommodation hole 60 for accommodating the attracted body 22 is also not provided with a notch shape such as the side wall 52e of the accommodation hole 52. Therefore, the attracted body 22 can be fixed to the accommodation hole 60 with a larger bonding area than the magnet 21, and thus a protrusion for preventing coming off such as the locking part 21e is omitted. However, it is needless to say that the attachment structure of the attracted body 22 to the wall portion 19Ba may be the same as the attachment structure of the magnet 21 to the wall portion 19Aa.

As described above, the electronic apparatus 10 according to the present embodiment has the magnet 21 attached to the wall portion 19Aa of the first chassis member 12A, and the attracted body 22 attached to the wall portion 19Ba of the second chassis member 12B and attracted to the magnet 21 in the 0-degree posture. The wall portion 19Aa has the accommodation hole 52 that has the opening portion 52a facing the side of the wall portion 19Ba in the 0-degree posture and accommodates the magnet 21, and the recessed portion 52d formed in a part of the side inner wall surface 52b of the accommodation hole 52 and recessed in a direction intersecting the direction of inserting the magnet 21 into the accommodation hole 52. The magnet 21 is provided so as to protrude from a part of the side surface 21a and has the locking part 21e inserted into the recessed portion 52d.

Therefore, in the electronic apparatus 10, the magnet 21 is prevented from coming off from the accommodation hole 52 by locking the locking part 21e to an inner surface of the recessed portion 52d. Therefore, in the electronic apparatus 10, for example, even when the adhesion quality of the magnet 21 is poor and the magnet 21 is not securely fixed to the side inner wall surface 52b or the like with the adhesive 54, the magnet 21 can be prevented from falling off from the accommodation hole 52. As a result, the electronic apparatus 10 can prevent the magnet 21 from falling off during assembly, from making contact with other electronic components such as the display 28, and from causing a failure. Moreover, the accommodation hole 52 is formed at a position facing the side of the wall portion 19Ba of the other side when the opening portion 52a is in the 0-degree posture. That is, as illustrated in FIG. 4, only the bezel member 20 is disposed between the magnet 21 and the attracted body 22 in the 0-degree posture, and other members are not disposed. Therefore, the top surface 21c of the magnet 21 is as close to the attracted body 22. As a result, the electronic apparatus 10 can increase an attracting force between the magnet 21 and the attracted body 22 to prevent the opening or rattling of the chassis members 12A and 12B in the 0-degree posture.

In this case, the magnet 21 of the present embodiment is located while facing the folding portion 40b of the display 28. Since the folding portion 40b is a portion in which the extended portion 40 of the display body 36 is bent, if the magnet 21 contacts, a failure may be caused compared to other portions of the display 28. From this point of view, since the magnet 21 is prevented from coming off from the accommodation hole 52 by the locking part 21e described above, it is possible to prevent the magnet 21 from making contact with the folding portion 40b. In particular, in the present embodiment, the spacer member 56 is used to prevent the displacement of the magnet 21 in the accommodation hole 52, so that the contact between the magnet 21 and the folding portion 40b can be more reliably avoided.

Further, the electronic apparatus 10 according to the present embodiment has the magnet 21 attached to the wall portion 19Aa of the first chassis member 12A, and the attracted body 22 attached to the wall portion 19Ba of the second chassis member 12B and attracted to the magnet 21 in the 0-degree posture. The folding portion 40b that is folded to the rear side is provided between the display 28 and the control board 32 so as to wrap around one side 16b of the display 28. The magnet 21 has the relief portion 21d that faces the folding portion 40b, retreats from the folding portion 40b so as to avoid the folding portion 40b, and forms the predetermined gap C between the relief portion 21d and the folding portion 40b.

Therefore, even if some displacement occurs in a state in which the magnet 21 is attached to the wall portion 19Aa, the electronic apparatus 10 can avoid the magnet 21 from making contact with the folding portion 40b, and can prevent the display 28 from causing a failure. Moreover, since the magnet 21 has the relief portion 21d, a volume of the entire magnet can be secured to the maximum extent while preventing the contact with the folding portion 40b, and the attracting force to the attracted body 22 can be increased. As a result, the electronic apparatus 10 can increase an attracting force between the magnet 21 and the attracted body 22 to prevent the opening or rattling of the chassis members 12A and 12B in the 0-degree posture.

In particular, in the present embodiment, the wall portion 19Aa of the first chassis member 12A facing the folding portion 40b has a width dimension in the X direction, which is smaller than that of the wall portion 19Ba of the second chassis member 12B, because the folding portion 40b protrudes in the X direction. Therefore, the magnet 21 is disposed so as to more easily interfere with the folding portion 40b through the side wall 52e of the accommodation hole 52. Therefore, the electronic apparatus 10 more reliably suppresses the interference of the magnet 21 with the folding portion 40b by locking the locking part 21e with the recessed portion 52d.

In the above, the electronic apparatus 10 that can be folded in half like a book is exemplified. It is possible to apply the present invention to, in addition to a configuration of folding the same-shaped chassis in half, for example, various configurations, such as a double-door configuration in which small chassis are foldably connected to the left and right edge portions of a large chassis, an S-shaped folding configuration in which chassis with different folding directions are connected to the left and right edge portions of one chassis, and a J-shaped folding configuration in which a small chassis is foldably connected to one of the left and right edge portions of a large chassis, and the number of chassis to be connected may be four or more.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

DESCRIPTION OF SYMBOLS 10 electronic apparatus
12A first chassis member
12B second chassis member
14 hinge device
16 display assembly
19A, 19Aa, 19B, 19Ba wall portion
20 bezel member
21 magnet
21e locking part
22 attracted body
28 display
36 display body
40b folding portion
52, 60 accommodation hole
52a opening portion
52d recessed portion
56 spacer member

What is claimed is:

1. An electronic apparatus comprising:
a first chassis member that has a first wall portion;
a second chassis member that has a second wall portion and is adjacent to the first chassis member;
a hinge device that connects the first chassis member and the second chassis member to be relatively rotatable between a first posture, in which the first chassis member and the second chassis member are laminated so as to overlap each other in a surface normal direction, to dispose the first wall portion and the second wall portion at positions facing each other, and a second posture in which the first chassis member and the second chassis member are arranged side by side in a direction perpendicular to the surface normal direction;
a magnet that is attached to the first wall portion;
an attracted body that is attached to the second wall portion and attracts the magnet in the first posture;
a display formed in a sheet shape having flexibility, extending over the first chassis member and the second chassis member, and having one side of an outer peripheral edge portion provided at a position facing the first wall portion; and
a control board connected to the display to control display of the display,
wherein a folding portion that is folded to a rear side of the display is provided between the display and the control board so as to wrap around the one side, and
the magnet has a relief portion that faces the folding portion, retreats from the folding portion to avoid the folding portion, and forms a predetermined gap between the relief portion and the folding portion.

2. The electronic apparatus according to claim 1,
wherein the display has a display body including an active region and a non-active region, and
the folding portion is formed by extending and bending a part of the non-active region.

3. The electronic apparatus according to claim 1,
wherein the magnet has a side surface and a bottom surface,
the first wall portion has
an accommodation hole formed to be inserted with the magnet, having an opening portion facing a side of the second wall portion in the first posture, a side inner wall surface supporting the side surface of the magnet, and a bottom wall surface supporting the bottom surface of the magnet, and accommodating the magnet, and
a recessed portion formed in a part of the side inner wall surface of the accommodation hole and recessed in a direction intersecting a direction of inserting the magnet into the accommodation hole, and
the magnet further has a locking part protruding from a part of the side surface and inserted into the recessed portion.

4. The electronic apparatus according to claim 3, further comprising a bezel member provided to straddle the first wall portion and the display, and adhesively fixed to the first wall portion and the display,
wherein the bezel member closes the opening portion of the accommodation hole in which the magnet is accommodated.

5. The electronic apparatus according to claim 1, further comprising:
a spacer member disposed between the side inner wall surface of the accommodation hole and the side surface of the magnet to prevent the locking part from coming off from the recessed portion by restricting a movement of the magnet in the accommodation hole.

\* \* \* \* \*